United States Patent
Fu et al.

(10) Patent No.: US 11,610,925 B2
(45) Date of Patent: Mar. 21, 2023

(54) IMAGING SYSTEM AND METHOD OF CREATING COMPOSITE IMAGES

(71) Applicant: Applied Materials, Inc., Santa Clara, CA (US)

(72) Inventors: Jinxin Fu, Fremont, CA (US); Yongan Xu, Santa Clara, CA (US); Ludovic Godet, Sunnyvale, CA (US); Naamah Argaman, San Jose, CA (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 221 days.

(21) Appl. No.: 16/859,708

(22) Filed: Apr. 27, 2020

(65) Prior Publication Data

US 2020/0388642 A1    Dec. 10, 2020

Related U.S. Application Data

(60) Provisional application No. 62/858,258, filed on Jun. 6, 2019.

(51) Int. Cl.
    *H01L 27/146*      (2006.01)
    *G02B 1/00*      (2006.01)
    (Continued)

(52) U.S. Cl.
    CPC ........ *H01L 27/14627* (2013.01); *G02B 1/002* (2013.01); *G02B 27/005* (2013.01); *H01L 27/14621* (2013.01); *H04N 5/374* (2013.01)

(58) Field of Classification Search
    CPC ............. H04N 5/374; H01L 27/14621; H01L 27/14627; G06T 5/50; G06T 2207/10024;
    (Continued)

(56) References Cited

U.S. PATENT DOCUMENTS

| 7,019,890 B2 | 3/2006 | Meredith et al. |
| 7,366,351 B2 | 4/2008 | Walmsley et al. |

(Continued)

FOREIGN PATENT DOCUMENTS

WO      2016/168173 A1      10/2016

OTHER PUBLICATIONS

International Search Report and Written Opinion for International Application No. PCT/US2020/030036 dated Aug. 11, 2020.

(Continued)

*Primary Examiner* — Lin Ye
*Assistant Examiner* — Chriss S Yoder, III
(74) *Attorney, Agent, or Firm* — Patterson + Sheridan, LLP

(57) ABSTRACT

An imaging system and a method of creating composite images are provided. The imaging system includes one or more lens assemblies coupled to a sensor. When reflected light from an object enters the imaging system, incident light on the metalens filter systems creates filtered light, which is turned into composite images by the corresponding sensors. Each metalens filter system focuses the light into a specific wavelength, creating the metalens images. The metalens images are sent to the processor, wherein the processor combines the metalens images into one or more composite images. The metalens images are combined into a composite image, and the composite image has reduced chromatic aberrations.

16 Claims, 6 Drawing Sheets

(51) Int. Cl.
*G02B 27/00* (2006.01)
*H04N 5/374* (2011.01)

(58) Field of Classification Search
CPC .......... G06T 2207/20221; G02B 1/002; G02B 5/201; G02B 27/005; G02B 27/0075
See application file for complete search history.

(56) References Cited

U.S. PATENT DOCUMENTS

| | | | |
|---|---|---|---|
| 9,151,891 B2 | 10/2015 | Ma et al. | |
| 9,298,060 B2 | 3/2016 | Shen et al. | |
| 9,647,150 B2 | 5/2017 | Blasco Claret | |
| 9,813,615 B2* | 11/2017 | Lee | H04N 5/2258 |
| 10,403,668 B2* | 9/2019 | Arbabi | H01L 27/14621 |
| 2006/0054782 A1* | 3/2006 | Olsen | G02B 9/12 348/E5.037 |
| 2006/0187312 A1* | 8/2006 | Labaziewicz | H04N 5/2254 348/E5.042 |
| 2012/0189293 A1* | 7/2012 | Cao | H04N 5/2258 396/333 |
| 2013/0119236 A1 | 5/2013 | Lenchenkov | |
| 2016/0080657 A1* | 3/2016 | Chou | H04N 5/23296 348/360 |
| 2016/0117829 A1* | 4/2016 | Yoon | H04N 5/232935 348/222.1 |
| 2016/0316147 A1* | 10/2016 | Bernstein | G06F 3/04842 |
| 2016/0316180 A1* | 10/2016 | Han | G02B 5/1876 |
| 2017/0064174 A1* | 3/2017 | Xiao | H04N 5/2258 |
| 2018/0020148 A1* | 1/2018 | Zhou | G06T 5/50 |
| 2018/0284428 A1 | 10/2018 | Guenter | |
| 2019/0086683 A1 | 3/2019 | Aieta et al. | |
| 2019/0098187 A1 | 3/2019 | Wang et al. | |
| 2019/0098210 A1 | 3/2019 | Fukuda | |

OTHER PUBLICATIONS

Avayu et al., Composite Functional Metasurfaces for Multispectral Achromatic Optics, Nature Communications 8, 14992 (2017), 7 pp.
Khoraseninejad et al., Achromatic Metalens over 60 nm Bandwidth in the Visible and Metalens with Reverse Chromatic Dispersion, Nano Letters 17, 1819 (2017), 6 pp.
Chen et al., GaN metalens for pixel-level full-cover routing at visible light, Nano Letters 27, 6345 (2017).
Technology, www.light.co/technology, retrieved Apr. 9, 2019.
A Broadband Achromatic Metalens for Focusing and Imaging in the Visible, Chen et al., Nature Nanotechnology 13, 220 (2018), 31 pp.
Devlin et al., Broadband High-efficiency Dielectric Metasurfaces for the Visible Spectrum, Proceedings of the National Academy of Sciences 13, 10473 (2016), 6 pp.
Aieta et al., Multiwavelength Achromatic Metasurfaces by Dispersive Phase Compensation, Science 347, 1342 (2015), 15 pp.
Capasso, Metaoptics, <http://www.bostonphotonics.org/files/seminars/EOW-2017-FCapasso.pdf>, Harvard University, Capasso Group, retrieved Apr. 14, 2019.
Phan et al., High-efficiency large area topology-optimized metasurfaces, Phan et al., Light Science and Applications 8, 1-9, 2019.

* cited by examiner

IMAGING SYSTEM AND METHOD OF CREATING COMPOSITE IMAGES

CROSS-REFERENCE TO RELATED APPLICATIONS

This application claims benefit of U.S. Provisional Patent Application Ser. No. 62/858,258, filed Jun. 6, 2019, which is herein incorporated by reference.

BACKGROUND

Field

Embodiments of the invention relate to an apparatus and a method and, more specifically, to an imaging system and method of creating composite images.

Description of the Related Art

Imaging systems used to take pictures are common in the art, with varied applications, including cameras and scanners. Imaging systems typically contain multiples lenses, composite lenses, and films, in order to reduce aberrations caused by imperfections in lenses. The refractive index of most transparent materials decreases with increasing wavelength. Since the focal length of a lens depends on the refractive index, this variation in refractive index affects focusing, resulting in chromatic aberrations. Lenses with chromatic aberrations cause "fringes" of color along boundaries that separate dark and bright parts of images.

In order to combat chromatic aberrations, composite lenses with multiple layers of lenses are often used, to minimize or hopefully entirely remove chromatic aberrations in the image. However, composite lenses include multiple lenses stacked vertically, and thus are often bulky, causing lens extrusion problems for smartphones and other devices. In addition, conventional infrared (IR) lenses have limited material choices, due to the low refractive index of commonly used materials.

Metalenses are much smaller than traditional lenses and composite lenses (sizes on the microscale or nanoscale, with thickness often smaller than 1 µm), and show promise for replacing conventional lenses in a variety of imaging applications. Metalens fabrication is also compatible with conventional semiconductor manufacturing. One drawback of metalenses is that they also suffer from chromatic aberrations even more severely than in conventional lenses. Metalenses are typically useful only for extremely narrow wavelengths of light, so they are unable to be used for full color images.

Therefore, there is a need for an apparatus and method that can utilize metalenses over a wide range of light wavelengths.

SUMMARY

In one embodiment, an imaging system is provided, including one or more lens assemblies, each lens assembly including a plurality of metalens filter systems, including a plurality of metalenses, and a plurality of color filters, each color filter coupled to one of the plurality of metalenses, with the central pass-through wavelengths of the color filter being the same as the working wavelengths of the corresponding metalens, and a plurality of sensors, each sensor coupled to a metalens filter system, and a controller comprising a processor configured to combine a metalens image from each of the plurality of metalenses into a composite image.

In another embodiment, an imaging system is provided, including one or more lens assemblies, each lens assembly including a plurality of metalens filter systems, including a plurality of metalenses, and a plurality of color filters, each color filter coupled to one of the plurality of metalenses, with the central pass-through wavelengths of the color filter being the same as the working wavelengths of the corresponding metalens, and a plurality of sensors, each sensor coupled to a metalens filter system, and a controller comprising a processor configured to combine a metalens image from each of the plurality of metalenses into a composite image. The plurality of metalens filter systems include at least one red metalens filter system, at least one green metalens filter system, and at least one blue metalens filter system.

In another embodiment, an imaging system is provided, including one or more lens assemblies, each lens assembly including a focusing lens, and a metalens assembly including a plurality of metalenses, a sensor coupled to the one or more lens assemblies, and a controller including a processor configured to combine a metalens image from each of the plurality of metalenses into a composite image. The plurality of metalenses include at least one red metalens, at least one green metalens, and at least one blue metalens.

In another embodiment, a method of creating one or more composite images is provided, including exposing an imaging system comprising one or more lens assemblies to light, wherein each lens assembly includes a plurality of metalens filter systems, including a plurality of metalenses, and a plurality of color filters, each color filter coupled to one of the plurality of metalenses, with the central pass-through wavelengths of the color filter being the same as the working wavelengths of the corresponding metalens, the plurality of metalens filter systems comprises at least one red metalens with a red color filter, at least one green metalens with a green color filter, and at least one blue metalens with a blue color filter, and a plurality of sensors, each sensor coupled to a metalens filter system, wherein the light passes through the plurality of metalenses filter systems such that each of the plurality of metalenses filter systems creates a metalens image, exposing a plurality of sensors to each of the plurality of metalens images, the sensor coupled to the metalens filter systems, sending the plurality of metalens images to a processor, and combining the plurality of metalens images into the one or more composite images using the processor.

The imaging system mitigates any chromatic aberrations caused by the metalenses because each of the metalenses focuses light into a different wavelength range, creating a separate metalens image. The metalens images are combined into a composite image, and thus chromatic aberrations in the final image are reduced.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include an imaging system using one or more lens assemblies, and a method of creating one or more composite images. An imaging system is exposed to light reflected from an object, and the light is filtered through a plurality of metalens filter systems. Metalens images, which are created from focused light in specific narrow wavelengths at a plurality of sensors, are then combined into composite images. The resulting composite images are substantially free from chromatic aberrations. Embodiments of the disclosure provided herein may be especially useful for, but are not limited to, imaging systems used for, and methods of, creating composite images using metalenses.

As used herein, the term "about" refers to a +/−10% variation from the nominal value. It is to be understood that such a variation can be included in any value provided herein.

Figure 1A:
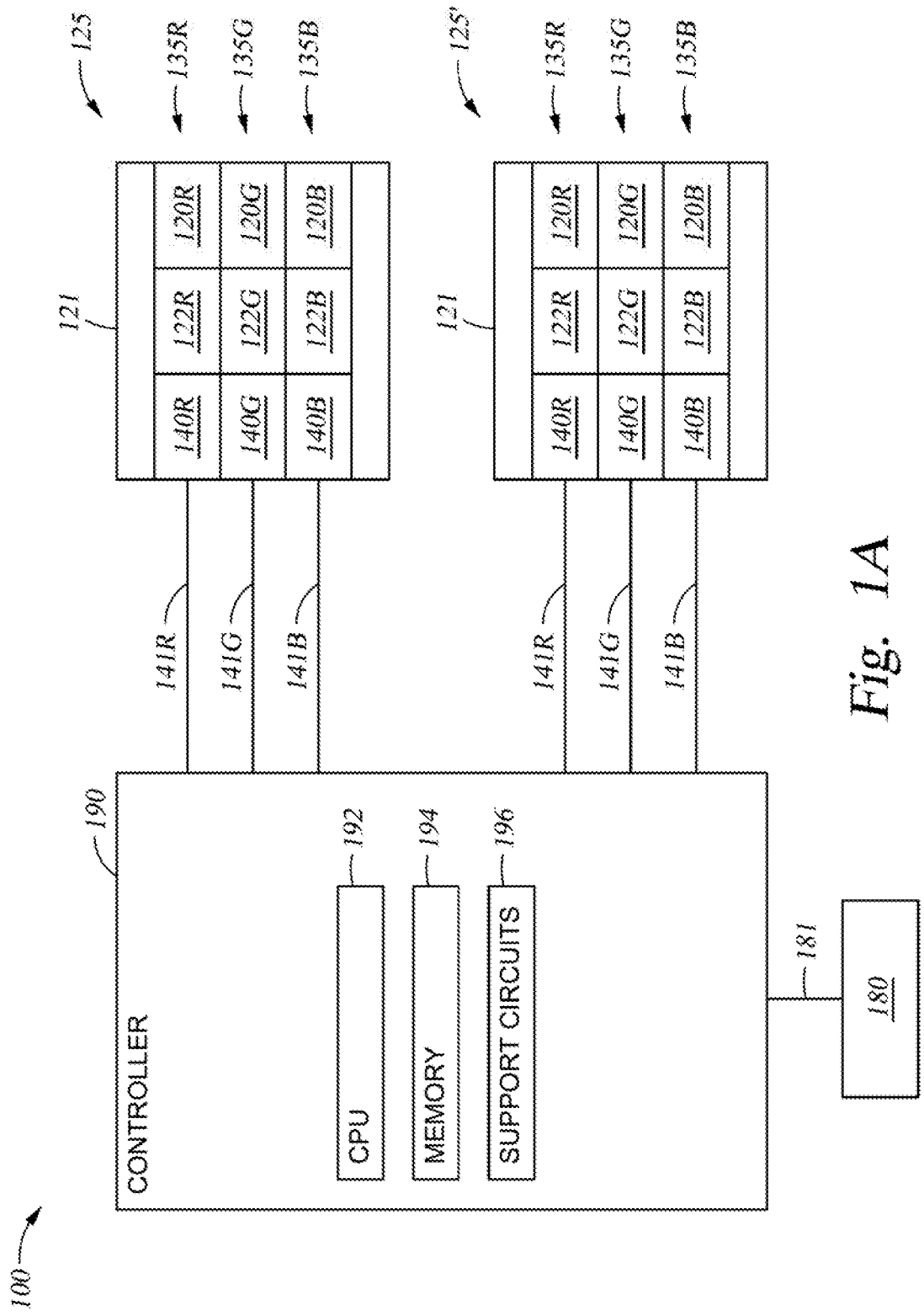
FIG. 1A illustrates an imaging system, according to one embodiment.

FIG. 1A illustrates an imaging system 100, according to one embodiment. As shown, the imaging system 100 includes a controller 190, and one or more lens assemblies 125. As shown, the one or more lens assemblies 125 include a base 121, a plurality of metalens filter systems 135, and a plurality of sensors 140. The lens assemblies 125 can have a width of about 100 µm to about 15 mm. The width between lens assemblies 125 can vary with the application. For example, the width between lens assemblies 125 can be modified to take a traditional two-dimensional image, or the width can be increased to take a three-dimensional or stereoscopic image.

Although parts of the disclosure describe exposing the imaging system 100 to white light, it is understood that this is an example, and the imaging system 100 can be exposed to any spectrum of light, including but not limited to, white light, visible light, or pre-filtered light.

The metalens filter systems 135 are disposed in the base 121. As shown, the metalens filter systems 135 include a metalens 120 and a color filter 122. The metalens 120 focuses light of a certain wavelength at a chosen focal length of the metalens. The color filter 122 is disposed below the metalens 120. The central pass-through wavelengths of the color filter 122 is the same as the working wavelengths of the corresponding metalens 120. For example, a red metalens 120R with a focal length of about 1 cm focuses red light at a distance of about 1 cm from the metalens 120R. The red color filter 122R then filters non-red light from the image created by the red metalens 120R, and this filtered image is incident on the sensor 140R, resulting in a metalens image sensed by the sensor, where the metalens image includes mostly red light from the original object. An adjacent green metalens 120G with the same focal length as the red metalens 120R focuses green light at a distance of about 1 cm from the metalens 120G. The green color filter 122G then filters non-green light from the image created by the green metalens 120G, and this filtered image is incident on the sensor 140G, resulting in a metalens image sensed by the sensor, where the metalens image includes mostly green light from the original object. The metalens images are then combined to make a composite image, which is described in more detail below. The result is that the each lens assembly 125 has a single focal length that may be different from that of the other lens assemblies 125, 125'.

Although FIG. 1A shows the white light incident on the metalens 120 before the focused light is focused onto the color filter 122, the color filter can be placed in front of the metalens, such that the white light is filtered by the color filter before the filtered light is incident on the metalens 120. The color filter 122 can be any of those used in the art, such as a Bayer filter. The color filter 122 can also itself be a metalens or metasurface. In addition, the metalens 120 can include stacks of individual metalenses, grown with transparent substrates in between, such as glass or plastic.

The one or more lens assemblies 125, 125' have different focal lengths, and the lens assemblies make up a varifocal lens system, according to some embodiments. The focal length of the lens assembly 125 can vary from about 0.5 mm to about 2000 mm. The different focal lengths allows for the imaging system 100 to accurately image objects at variety of distances. For example, the lens assembly 125 has a focal length of about 0.5 mm, allowing for imaging objects very close to the imaging system 100, and the lens assembly 125' has a focal length of 2000 mm, allowing for imaging objects very far from the imaging system 100.

Figure 1B:
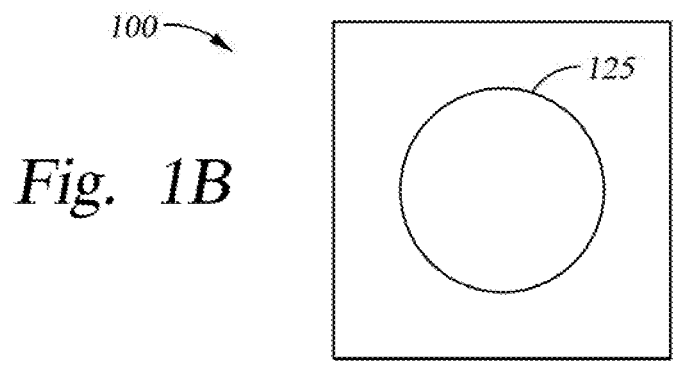
FIGS. 1B-E illustrate arrangements of one or more lens assemblies, according to some embodiments.
Figure 1C:
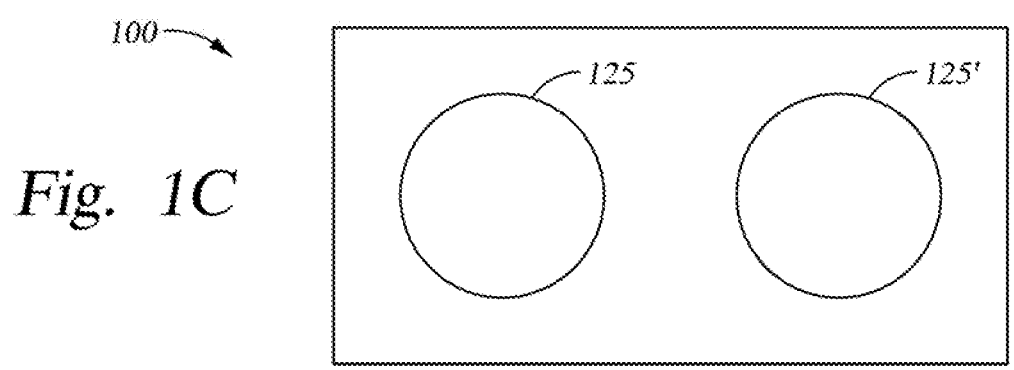
Figure 1D:
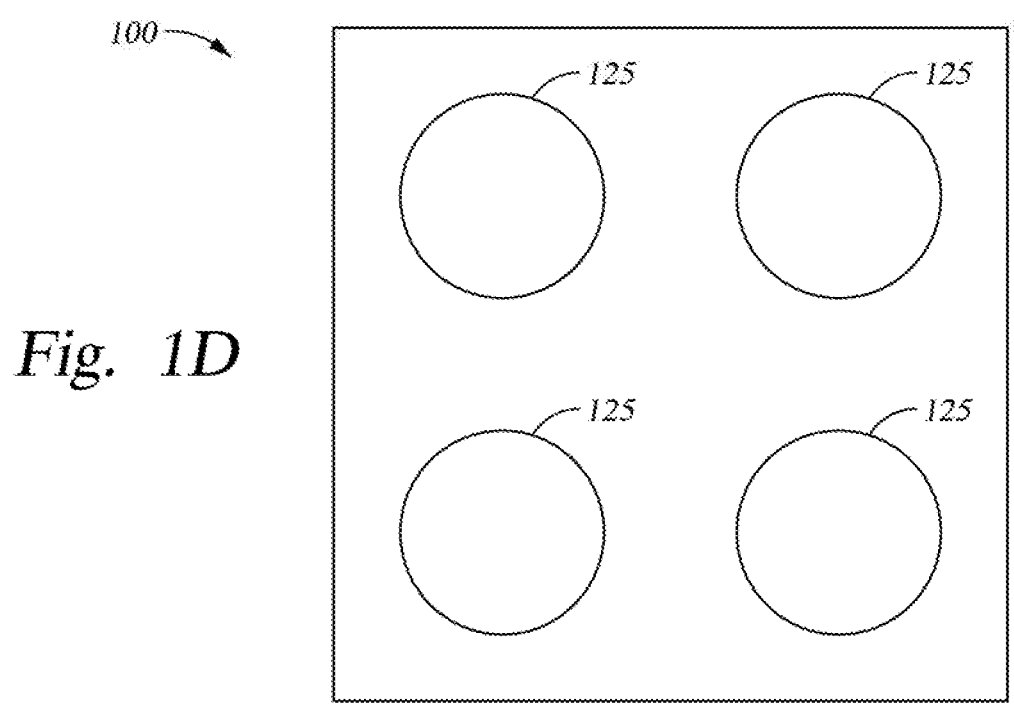
Figure 1E:
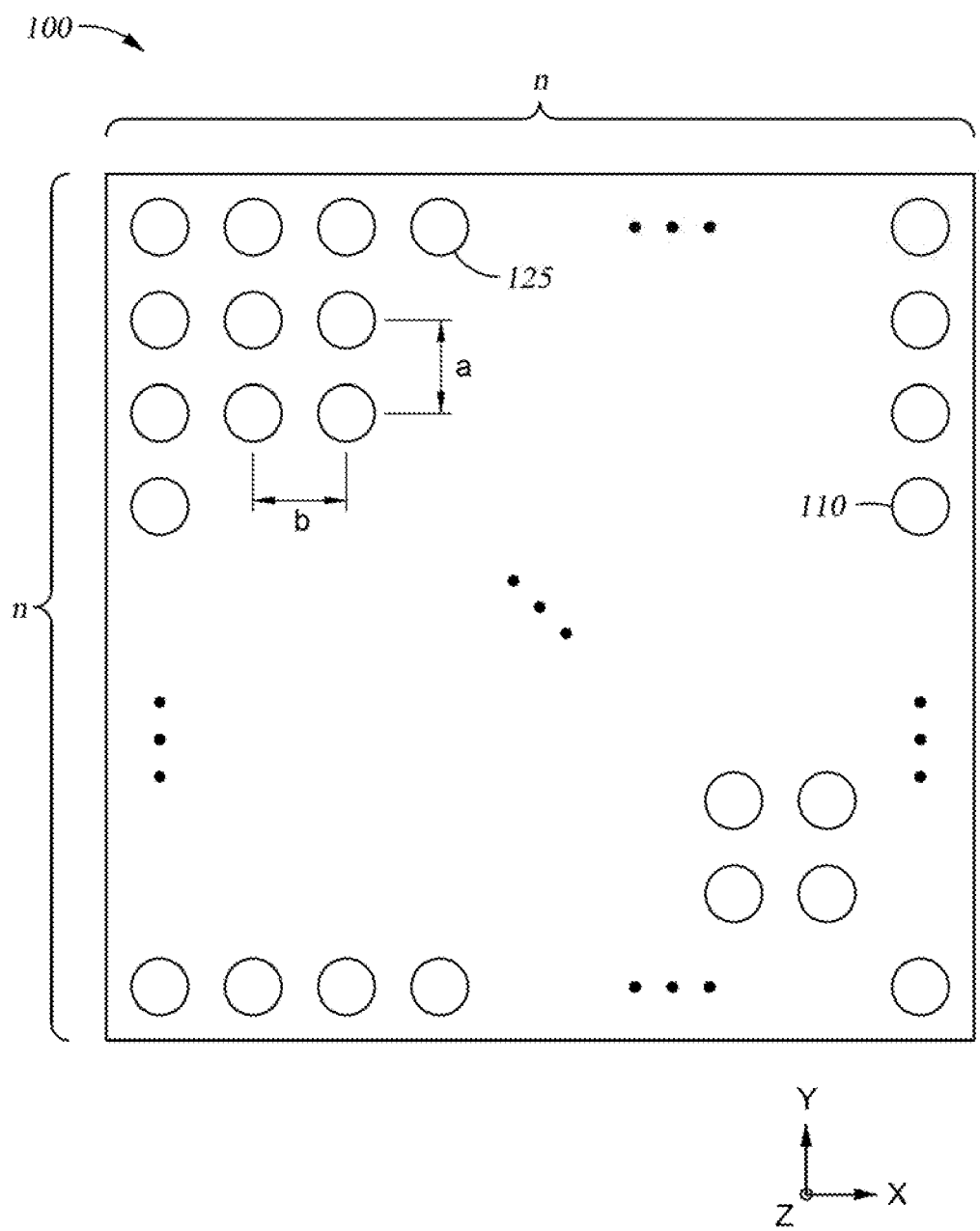

FIGS. 1B-E illustrate arrangements of one or more lens assemblies 125, according to some embodiments. FIG. 1B shows an imaging system 100 with one lens assembly 125. FIG. 1C shows an imaging system 100 with two lens assemblies 125. FIG. 1D shows an imaging system 100 with four lens assemblies 125 in a 2×2 grid. FIG. 1E shows an imaging system 100 with n×n' lens assemblies 125, where n and n' are any integer. n and n' can be the same number, or different numbers. The lens assemblies 125 can be arranged in any suitable pattern, such as, but not limited to, a grid, as shown in FIG. 1D, a spiral, a circle, or any other suitable shape, depending on the application. There are four lens assemblies 125 that are arranged in a grid as shown in FIG. 1C, according to one embodiment. In a grid, the lens assemblies 125 can have a separation a in the y direction, and a separation b in the x direction. The separation a and the separation b can be the same or different. The lens assemblies 125 can be separated by about 500 µm to about 10 cm, depending on the purpose of the imaging system 100. For example, for single image capture, the lens assemblies 125 can be separated by about 500 µm to about 3 cm. For multi-image capture, the lens assemblies 125 can be separated by about 3 cm to about 15 cm.

Figure 2A:
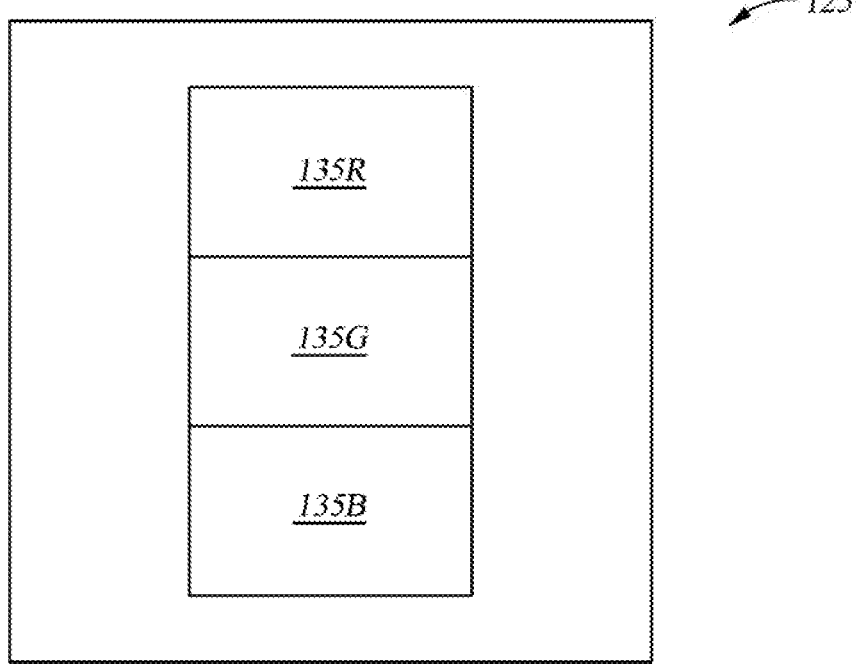
FIGS. 2A and 2B illustrate arrangements of metalens filter systems, according to some embodiments.
Figure 2B:
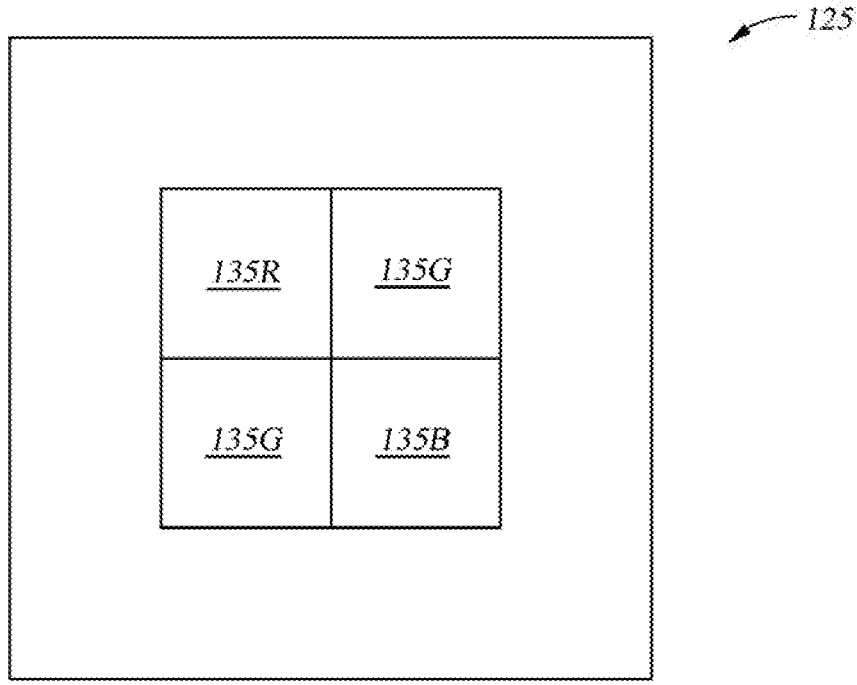

FIGS. 2A and 2B illustrate arrangements of the metalens filter systems 135, according to some embodiments. The metalens filter systems 135 include at least one red metalens filter system 135R, at least one green metalens filter system 135G, and at least one blue metalens filter system 135B, wherein, for example, the green metalens filter system includes a green metalens 120G and a green color filter 122G. The metalens filter systems 135 includes at least two green metalens filter systems 135G, according to one embodiment. The red metalens filter system 135R filters white light to leave red light at a wavelength of about 600 nm to about 700 nm, the green metalens filter system 135G filters white light to leave green light at a wavelength of about 500 nm to about 560 nm, and the blue metalens filter system 135B filters white light to leave blue light at a wavelength of about 440 nm to about 490 nm.

FIG. 2A shows red metalens filter system 135R, green metalens filter system 135G, and blue metalens filters system 135B. The green metalens filter system 135G is placed between the red metalens filter system 135R and the blue metalens filter system 135B. By arranging the metalenses filter systems 135 in this arrangement, the total area of the metalens filter systems can be reduced, allowing for reduction in size of the lens assembly 125.

FIG. 2B shows a red metalens filter system 135R, two green metalenses filter systems 135G, and a blue metalens filter system 135B. In the illustrated arrangement, the four metalenses filter systems 135 are arranged in a grid, the red metalens filter system 135R is disposed adjacent to two green metalens filter systems 135G, and the blue metalens filter system 135B is disposed adjacent to two green metalens filter systems 135G, according to one embodiment. Metalens filter systems 135 arranged as shown in FIG. 2B can be used in order to achieve a higher luminance resolution than chrominance resolution.

Although FIGS. 2A and 2B show metalens filter systems 135 for red, green, and blue, any color metalens filter systems can be placed in the lens assembly 120. In addition, it is contemplated that metalens filter systems 135 for nonvisible light, such as IR and UV, could be used as well.

Figure 3A:
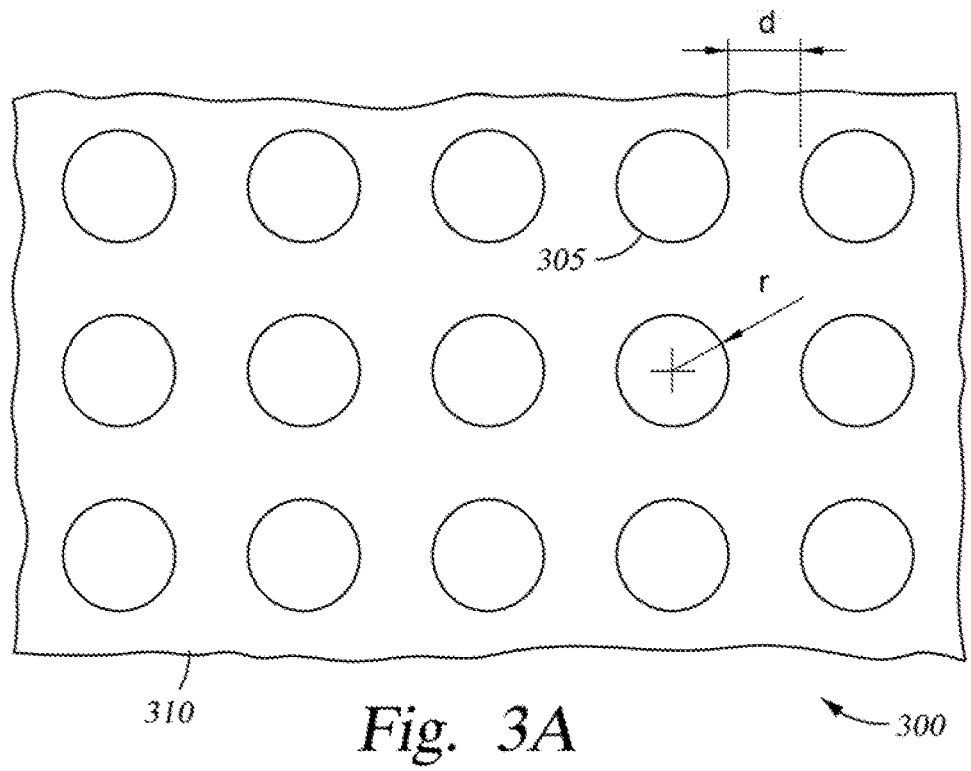
FIG. 3A illustrates an overhead view of a portion of a plurality of metalens features, according to one embodiment.

FIG. 3A illustrates an overhead view of a portion 300 of a plurality of metalens features 305, according to one embodiment. The metalens 120 includes repeated patterns of the metalens features 305. The metalens features 305 are nanosized columns grown on a substrate 310. The metalens features 305 have differing shapes depending on the desired spectrum of light to filter. The metalens features 305 can be substantially circular, triangular, square, rectangular, or have an uneven shape. The metalens features 305 can be made from any suitable high refractive index material, such as, but not limited to, silicon, silicon oxide, silicon nitride, titanium, titanium oxide, tantalum oxide, zirconium oxide, hafnium oxide, gallium arsenide, gallium nitride, and niobium oxide. The substrate 310 can be any typical transparent substrate, such as glass. The substrate 310 can include any number of layers disposed thereon.

Figure 3B:
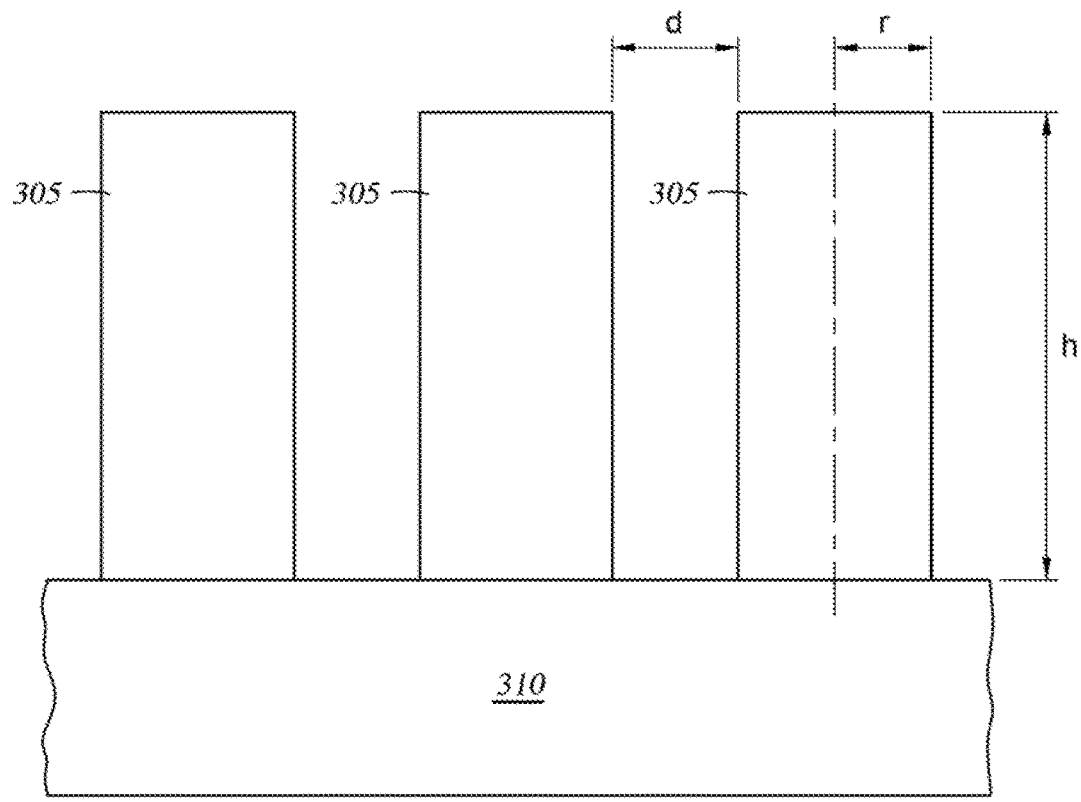
FIG. 3B illustrates a side view of a portion of a plurality of metalens features, according to one embodiment.

FIG. 3B illustrates a side view of a portion 300 of a plurality of metalens features 305, according to one embodiment. The metalens features 305 have a radius of r, which is from about 20 nm to about 500 nm. The metalens features 305 have a height of h, which is from about 10 nm to about 2 μm. The metalens features 305 are separated from each other by a separation distance d, which is from about 30 nm to about 500 nm. The radius, height, shape, material, and feature separation distance of the metalens features 305 are selected to create metalenses 120 that filters out all but a narrow wavelength band of light. For example, when the white light is incident onto the red metalens 120R, the red metalens 120R focuses the red light only.

In one embodiment, the metalens 120R, 120G, 120B have metalens features 305 with circular or elliptical shaped columns, the columns containing silicon dioxide ($SiO_2$), silicon (Si), titanium dioxide ($TiO_2$), titanium (Ti), or gallium nitride (GaN) material, the columns having a radius of about 30 nm to 500 nm, the columns having a height of about 10 nm to 2 um, and the columns having a separation of about 30 nm to 500 nm.

Referring back to FIG. 1A, the metalens filter systems 135 send filtered metalens image of the red, green, or blue light filtered by the metalens filter system, depending on the metalens filter system in question, to the corresponding sensor 140. The sensor 140 is any sensor that can receive and decode light information, such as a photosensor. The sensor 140 sends the metalens images to the controller 190.

The controller 190, such as a programmable computer, is connected to the sensor 140 by sensor connectors 141 to process the metalens images sent from the lens assemblies 125. The sensor connector 141 can be any kind of data connection, such as, but not limited to, a wire, fiber optic, or wireless connection, such as radio wireless local area networking (LAN), Wi-Fi, ultrahigh frequency (UHF) radio waves, or BLUETOOTH®. As shown, the controller 190 includes a processor, or central processing unit (CPU) 192, a memory 194, and support circuits 196, e.g., input/output circuitry, power supplies, clock circuits, cache, and the like. The memory 194 is connected to the CPU 192. The memory 194 is a non-transitory computer readable medium, and can be one or more readily available memory such as random access memory (RAM), read only memory (ROM), floppy disk, hard disk, or other form of digital storage. In addition, although illustrated as a single computer, the controller 190 could be a distributed system, e.g., including multiple independently operating processors and memories. This architecture is adaptable to various embodiments of imaging system 100 based on programming of the controller 190 to accept and analyze images sent from the sensor 140, such as metalens images.

The processor 192 combines the metalens images to make a composite image. The processor 192 uses any standard algorithm for this task, such as alpha compositing or image stitching. The processor 192 uses an image stitching algorithm, according to one embodiment. In the example given above, the metalens filter systems 135 are red, green, and blue, and the composite image is formed from the red-green-blue (RGB) color model. However, any appropriate set of metalens filter systems 135 can be used with an appropriate color model, such as, for example, cyan, magenta, and yellow metalenses, and the cyan-magenta-yellow (CMY) color model can be used to make the composite image. The combination of the metalens images by the processor 192 allows for a composite image with reduced chromatic aberrations.

Thus, the processor 192 takes the metalens images and combines them into a full color composite image, and the processor sends the composite image to a screen 180 via the screen connector 181. The screen connector 181 can be any kind of data connection, such as, but not limited to, a wire, fiber optic, or wireless connection, such as Wi-Fi or BLUETOOTH®. The screen 180 can be any kind of suitable display, such as a monitor or television. The screen 180 can have any resolution, such as standard definition, high definition (HD), or ultrahigh definition (UHD). The screen 180 can be a liquid-crystal display (LCD), light-emitting diode (LED) display, organic LED (OLED) display, and the like. If the imaging system 100 is part of a camera, the screen 180 can be part of the camera for viewing of the picture taken by the user. If the imaging system 100 is part of a smartphone or other cellular phone, the screen 180 can be part of the screen of the phone, or be the screen of the phone.

The metalens images are focused on a very specific wavelength of light (red, green, blue, etc.), and other wavelengths other than the designed ones are filtered by the metalens filter systems 135, and thus chromatic aberrations in the metalens images are reduced. When the composite image is created by the combination of the metalens images, chromatic aberrations in the composite image are minimized.

It is to be noted that each lens assembly 125 can provide a separate composite image, as each lens assembly can have a different focal length, and thus each composite image will be different. For example, an image taken of an object that is close by the lens assembly 125 with a short focal length will be substantially more in focus than an image taken by a lens assembly 125' with a very long focal length. In this case, the processor 192 is configured to send each of the composite images to the screen 180, where the user can pick and choose which image to save. The processor 192 can contain algorithms on how to choose the best quality composite image to provide to the screen, such as which composite image is in focus. The processor 192 determines which of the composite images to provide to the screen 180; and the processor provides the chosen composite image to the screen, according to one embodiment. The processor 192 can also be configured to combine two composite images to make at third composite image. For example, if one of the composite images is produced with a near focus, and another one of the composite images is produced with a far focus, the two composite images can be combine into a third composite image with full depth of field. In this case, the imaging system 100 can be used in a light-field imaging system, wherein the intensity of light in a scene, and also the direction that the light rays are traveling in space, can both be accounted for.

The imaging system 100 as described is useful for applications where the size of the lenses must be small. For example, the imaging system 100 can be used in a wearable device, such as a smart watch, or in a smartphone. The metalens filter systems 135 saves design spaces for large field of view, numerical apertures, and high efficiency optimization for metalens cameras.

Figure 4:
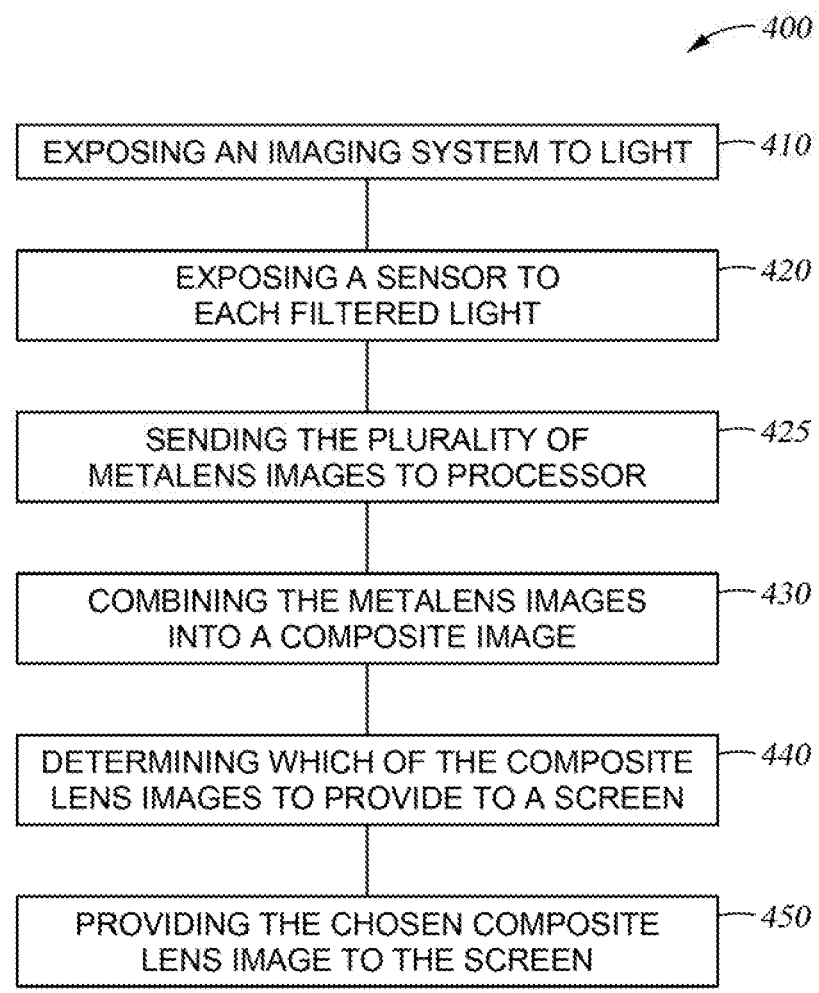
FIG. 4 is a flow diagram of method operations for creating a composite image, according to one embodiment.

FIG. 4 is a flow diagram of method operations 400 for creating a composite image, according to one embodiment. Although the method steps are described in conjunction with FIGS. 1A-E and 4, persons skilled in the art will understand that any system configured to perform the method steps, in any order, falls within the scope of the embodiments described herein.

The method begins at operation 410, where the imaging system 100, including one or more lens assemblies 125, is exposed to light. The one or more lens assemblies 125 are exposed to light reflected from an object, and the light is incident on the metalens filter systems 135 below. When the light is focused by the metalenses 120 in the metalens filter system 135, the focused light is passed through the color filter 122, resulting in filtered light of one color. For example, the red metalens filter system 135R creates filtered red light only.

At operation 420, each sensor 140 is exposed the filtered light to create each of the metalens images.

At operation 425, each sensor 140 sends its corresponding metalens images for each metalens filter system 135 to the processor 192 by the sensor connectors 141.

At operation 430, the processor 192 combines the plurality of metalens images into a composite image. The composite image can be made by any of the algorithms described above. The composite image is created by an image stitching algorithm, according to one embodiment. For example, if there are two lens assemblies 125, and each lens assembly includes three metalens filter systems 135 then a total of six metalens images will be combined by the processor 192, with two sets of three metalens images combined into two composite images.

In some embodiments, at optional operation 440, the imaging system 100 includes two or more lens assemblies 125, 125', wherein lens assemblies have different focal lengths, the lens assemblies make up a varifocal lens system, and the processor 192 decides which of the composite images to provide to the screen 180. For example, an image taken of an object that is close by the lens assembly 125 with a short focal length will be substantially more in focus than an image taken by a lens assembly 125' with a very long focal length. The processor 192 can contain algorithms on how to choose the best quality image to provide to the screen, such as which image is in focus.

At operation 450, the processor 192 provides the one or more composite images to the screen 180 via the screen connector 181. The processor 192 can provide all of the one or more composite images to the screen 180, where the user can select which of the composite images to save. As described above, the processor 192 can automatically determine which of the composite images to the screen. The processor 192 can also be configured to combine two composite images to make at third composite image. For example, if one of the composite images is produced with a near focus, and another one of the composite images is produced with a near focus, the two composite images can be combine into a third composite image with full depth of field. In this case, the imaging system 100 can be used in a light-field imaging system, wherein the intensity of light in a scene, and also the direction that the light rays are traveling in space can both be accounted for.

As described above, the imaging system 100 includes one or more lens assemblies 125 coupled to the processor 192. When reflected light from an object enters the lens assemblies 125, the metalens filter systems 135 filter light incident on sensors 140. Each metalens filter system 135 focuses the light into a specific wavelength, creating the metalens images at the sensors 140. The metalens images are sent to the processor 192, wherein the processor combines the metalens images into one or more composite images. The processor 192 sends the one or more composite images to the screen 180.

The imaging system 100 as described mitigates any chromatic aberrations caused by the metalenses 120 because each of the metalenses focuses a different wavelength of light. The metalens images are combined into a composite image, and the composite image has reduced chromatic aberrations. The lens assemblies 125 can be made smaller than traditional lenses. In addition, the lens assemblies 125 do not require multiple composite lenses, and thus the bulk of the lens assemblies can be minimized.

While the foregoing is directed to implementations of the present invention, other and further implementations of the invention may be devised without departing from the basic scope thereof, and the scope thereof is determined by the claims that follow.

We claim:

1. An imaging system, comprising:
   two or more lens assemblies, wherein each of the lens assemblies has a different focal length, each lens assembly comprising:
   a plurality of metalens filter systems, comprising:
   a plurality of metalenses; and
   a plurality of color filters, each color filter corresponding to one of the plurality of metalenses, with the central pass-through wavelengths of the color filter being the same as the working wavelengths of the corresponding metalens; and a plurality of sensors, each sensor coupled to a metalens filter system; and a controller comprising a processor configured to:

combine a metalens image from each of the plurality of metalenses of each lens assembly into a first composite image from a first lens assembly and a second composite image from a second lens assembly; and determine at least one composite image of a plurality of composite images to provide to a screen of the imaging system, wherein the plurality of composite images includes the first composite image, the second composite image, and a third composite image formed by combining the first composite image and the second composite image.

2. The imaging system of claim 1, wherein the plurality of metalens filter systems comprises at least one red metalens filter system, at least one green metalens filter system, and at least one blue metalens filter system.

3. The imaging system of claim 2, wherein the plurality of metalens filter systems comprise at least two green metalens filter systems.

4. The imaging system of claim 3, wherein the plurality of metalens filter systems are arranged in a grid, one of the at least one red metalens filter system is disposed adjacent to two green metalenses filter systems, and one of the at least one blue metalens filter systems is disposed adjacent to two green metalenses filter systems.

5. The imaging system of claim 1, wherein the two or more lens assemblies are arranged in a grid.

6. The imaging system of claim 5, wherein the two or more lens assemblies are four in number, and the lens assemblies are arranged in a 2×2 grid.

7. An imaging system, comprising:

two or more lens assemblies, wherein each of the lens assemblies has a different focal length, each lens assembly comprising:

a plurality of metalens filter systems, comprising:
a plurality of metalenses; and
a plurality of color filters, each color filter corresponding to one of the plurality of metalenses, with the central pass-through wavelengths of the color filter being the same as the working wavelengths of the corresponding metalens, wherein the plurality of metalens filter systems comprises at least one red metalens filter system, at least one green metalens filter system, and at least one blue metalens filter system; and a plurality of sensors, each sensor coupled to a metalens filter system; and a controller comprising a processor configured to:

combine a metalens image from each of the plurality of metalenses of each lens assembly into a first composite image from a first lens assembly and a second composite image from a second lens assembly; and determine at least one composite image of a plurality of composite images to provide to a screen of the imaging system, wherein the plurality of composite images includes the first composite image, the second composite image, and a third composite image formed by combining the first composite image and the second composite image.

8. The imaging system of claim 7, wherein the plurality of metalens filter systems comprise at least two green metalens filter systems.

9. The imaging system of claim 8, wherein the plurality of metalens filter systems are arranged in a grid, one of the at least one red metalens filter system is disposed adjacent to two green metalenses filter systems, and one of the at least one blue metalens filter systems is disposed adjacent to two green metalenses filter systems.

10. The imaging system of claim 7, wherein the two or more lens assemblies are arranged in a grid.

11. The imaging system of claim 10, wherein the two or more lens assemblies are four in number, and the lens assemblies are arranged in a 2×2 grid.

12. A method of creating one or more composite images, comprising:

exposing an imaging system comprising two or more lens assemblies to light, wherein each of the lens assemblies has a different focal length, wherein each lens assembly comprises:

a plurality of metalens filter systems, comprising:
a plurality of metalenses; and
a plurality of color filters, each color filter coupled to one of the plurality of metalenses, with the central pass-through wavelengths of the color filter being the same as the working wavelengths of the corresponding metalens, the plurality of metalens filter systems comprises at least one red metalens with a red color filter, at least one green metalens with a green color filter, and at least one blue metalens with a blue color filter; and a plurality of sensors, each sensor coupled to a metalens filter system, wherein the light passes through the plurality of metalenses filter systems such that each of the plurality of metalenses filter systems creates a metalens image;

exposing a plurality of sensors to each of the plurality of metalens images, the sensor coupled to the metalens filter systems;

sending the plurality of metalens images to a processor;

combining the plurality of metalens images of each lens assembly into a first composite image from a first lens assembly and a second composite image from a second lens assembly using the processor; and determining at least one composite image of a plurality of composite images to provide to a screen of the imaging system, wherein the plurality of composite images includes the first composite image, the second composite image, and a third composite image formed by combining the first composite image and the second composite image.

13. The method of claim 12, wherein the plurality of metalens filter systems comprise at least two green metalenses filter systems.

14. The method of claim 12, wherein the two or more lens assemblies are arranged in a grid.

15. The method of claim 14, wherein the two or more lens assemblies are four in number, and the lens assemblies are arranged in a 2×2 grid.

16. The method of claim 12, wherein the one or more composite images are created using an image stitching algorithm.

* * * * *